United States Patent
Fishburn et al.

(10) Patent No.: US 8,309,427 B2
(45) Date of Patent: Nov. 13, 2012

(54) MANUFACTURING METHOD FOR FIN-FET HAVING FLOATING BODY

(75) Inventors: Fredrick David Fishburn, Woodbridge, VA (US); Peter Strobl, Taipei (TW)

(73) Assignee: Inotera Memories, Inc., Taoyuan County (TW)

( * ) Notice: Subject to any disclaimer, the term of this patent is extended or adjusted under 35 U.S.C. 154(b) by 343 days.

(21) Appl. No.: 12/837,819

(22) Filed: Jul. 16, 2010

(65) Prior Publication Data

US 2011/0318903 A1    Dec. 29, 2011

(30) Foreign Application Priority Data

Jun. 24, 2010    (TW) ............................. 99120572 A

(51) Int. Cl.
   *H01L 21/76*    (2006.01)

(52) U.S. Cl. ................ 438/430; 438/424; 257/E21.546

(58) Field of Classification Search .................. 438/151, 438/157, 201, 424, 430, 435; 257/308, 330, 257/E21.546

See application file for complete search history.

(56) References Cited

U.S. PATENT DOCUMENTS

| | | | | |
|---|---|---|---|---|
| 6,977,404 B2 * | 12/2005 | Katsumata et al. | ........... | 257/301 |
| 7,504,304 B2 * | 3/2009 | Yaegashi et al. | ............. | 438/259 |
| 7,547,604 B2 * | 6/2009 | Tran | .............................. | 438/259 |
| 2007/0264771 A1 * | 11/2007 | Ananthan et al. | ............. | 438/243 |
| 2009/0137093 A1 * | 5/2009 | Lin | ................................ | 438/421 |
| 2010/0219467 A1 * | 9/2010 | Kim | ............................... | 257/330 |
| 2011/0220980 A1 * | 9/2011 | Parekh et al. | ................. | 257/302 |

* cited by examiner

*Primary Examiner* — Thanh V Pham
*Assistant Examiner* — Duy T Nguyen
(74) *Attorney, Agent, or Firm* — Rosenberg, Klein & Lee

(57) ABSTRACT

A manufacturing method for a FIN-FET having a floating body is disclosed. The manufacturing method of this invention includes forming openings in a poly crystalline layer; extending the openings downward; forming spacers on sidewalls of the openings; performing an isotropic silicon etching process on bottoms of the openings; performing deposition by using TEOS to form gate oxide.

10 Claims, 14 Drawing Sheets

MANUFACTURING METHOD FOR FIN-FET HAVING FLOATING BODY

FIELD OF THE INVENTION

The present invention relates to a manufacturing method for a fin field effect transistor (FIN-FET), and more specifically to a manufacturing method for a FIN-FET which can reduce the junction leakage current.

DESCRIPTION OF RELATED ART

An attempt of getting better channel on current and low leakage current makes the control over the access of DRAM complicate. In the currently available DRAM, the feature size of a recessed access device is about 80 nanometers, and that of a saddle at a bottom of a channel is about 50 nanometers, which significantly contributes to the increase in channel length.

In the case that the size is reduced to hundreds angstroms, elimination of electric field across the channel leads to improved electron mobility. For a MOS transistor to maintain constant potential for the purpose of control of the channel, the area where the source and drain contact with a substrate has high electric field. This results in problems of current leakage at the drain.

Therefore, there is a need of a novel invention that overcomes the above disadvantages.

SUMMARY OF THE INVENTION

It is one object of the present invention to provide a manufacturing method for a fin field effect transistor having a floating body, which removes grounded gates to form openings and isolation spaces and fills gate oxide to provide improved isolation, thereby blocking the current leakage path from cell sides to a substrate.

In order to achieve the above and other objectives, a manufacturing method for a fin field effect transistor having a floating body, including:
  providing a substrate, forming a shallow trench isolation structure and a shallow trench isolation oxide/nitride, forming a plurality of grounded gates in the shallow trench isolation structure and the shallow trench isolation oxide/nitride, and forming a poly crystalline layer over the shallow trench isolation structure and the shallow trench isolation oxide/nitride and between the grounded gates, wherein each grounded gate has a nitride layer, a metal gate and a recessed access device region;
  performing an etching process to form in the poly crystalline layer a plurality of openings which expose the corresponding grounded gates, wherein a bottom of each opening has a protrusion;
  removing each grounded gate so that the openings extend downward, wherein the openings in the shallow trench isolation structure has a depth between the depths of the recessed access device region and the shallow trench isolation structure, and the openings in the shallow trench isolation oxide/nitride has a similar depth as the recessed access device region;
  forming spacers on sidewalls of the openings;
  forming an opening in the shallow trench isolation structure to the substrate;
  performing an isotropic silicon etching to form isolation spaces at the bottom which extends to the underside of the drain of the FIN FET transistor; and
  filling up gate oxide in the openings and the isolation spaces.

This invention provides the following advantages: by means of the configuration over the substrate in the manner as mentioned above and interaction between the drain and source at bit line side, the increased on current of the access transistor can be reduced while data retention can be improved.

In order to further understand the techniques, means and effects the present invention takes for achieving the prescribed objectives, the following detailed descriptions and appended drawings are hereby referred, such that, through which, the purposes, features and aspects of the present invention can be thoroughly and concretely appreciated; however, the appended drawings are merely provided for reference and illustration, without any intention to be used for limiting the present invention.

DETAILED DESCRIPTION OF THE PREFERRED EMBODIMENTS

This invention provides a manufacturing method for a fin-type field effect transistor (referred to as "FIN-FET" here below) having a floating body. In the method according to the invention, the floating body is provided at a storage node to enhance the isolation effect and reduce leakage current.

Figure 1:
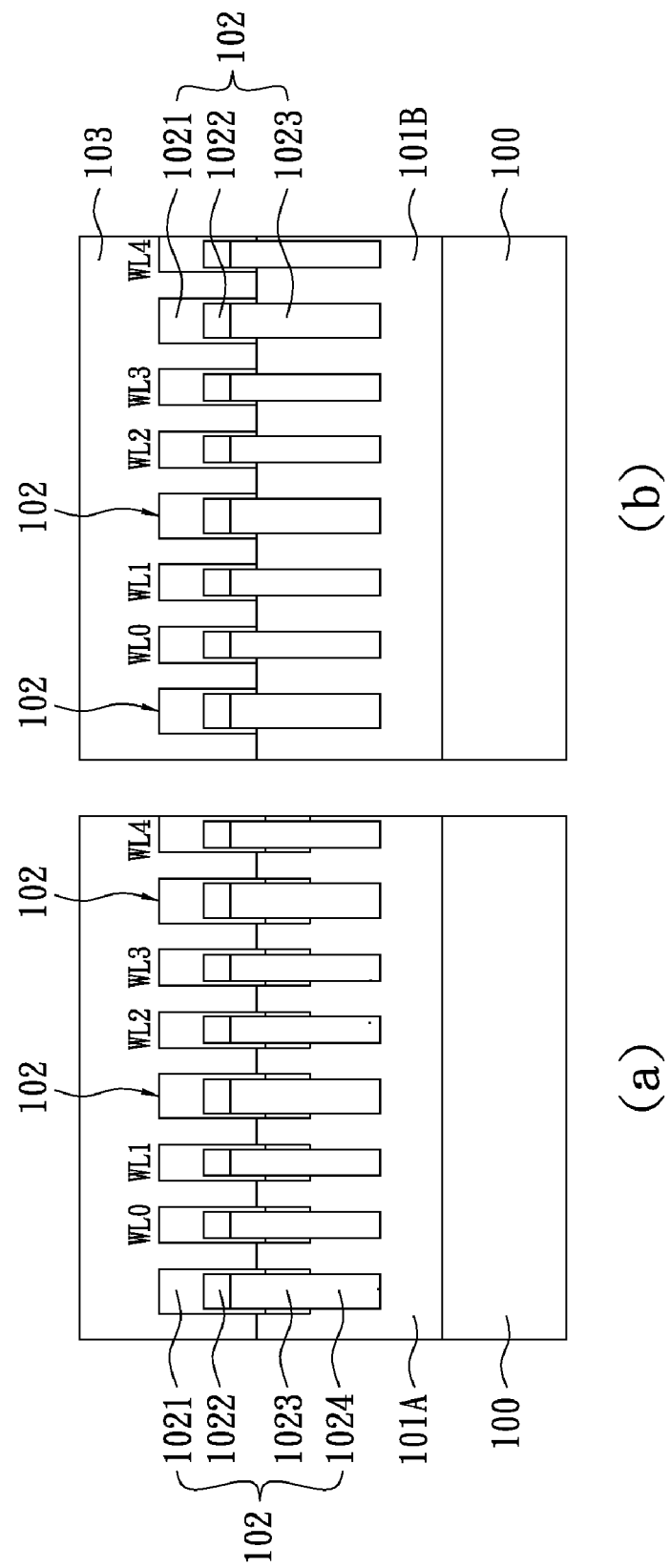
FIG. 1 through FIG. 14 illustrates a flow chart of a manufacturing method for a fin-type field effect transistor (FIN-FET) according to the invention.

According to one embodiment of the invention, the manufacturing method for a FIN-FET having a floating body includes the following steps. Referring to FIG. 1, a substrate 100 is provided. The substrate can be made of silicon. A shallow trench isolation (STI) structure 101A, as indicated by part (a) in FIG. 1, and a shallow trench isolation oxide/nitride 101B, as indicated by part (b) in FIG. 1, are formed over the substrate 100. Please note that the substrate 100 and the shallow trench isolation structure 101A are prime silicon material in the embodiment. The shallow trench isolation structure 101A and the shallow trench isolation oxide/nitride 101B respectively locate on their corresponding sections. A plurality of memory access gates and grounded gates 102 is formed in both of the shallow trench isolation structure 101A and the shallow trench isolation oxide/nitride 101B. A poly crystalline layer 103 is formed over the shallow trench isolation structure 101A and the shallow trench isolation oxide/nitride 101B, covering the grounded gates 102. Each of the grounded layers 102 has a nitride layer 1021, a metal gate 1022 and a recessed access device (RAD) region 1023. For example, the metal gate 1022 may be made of tungsten. A FIN-FET region 1024 further locates at a bottom of the RAD region 1023 of each grounded gate 102 of the shallow trench isolation structure 101A. However, no FIN-FET region 1024 is formed a bottom of the RAD region 1023 of each grounded gate 102 of the shallow trench isolation oxide/nitride 101B. Furthermore, word lines WL0, WL1, WL2, WL3 and WL4 are formed between the grounded gates 102. Please note that all the parts (a) shown in all figures of the invention schematically illustrate the shallow trench isolation structure 101A and the parts (b) schematically illustrate the shallow trench isolation oxide/nitride 101B.

Referring to FIG. 2 through FIG. 5, at the next step of the manufacturing method of the invention, an etching process is performed to form a plurality of openings 201 in the poly crystalline layer 103, exposing each of the grounded gates 102. Detailed description of this step will be illustrated below.

Figure 2:
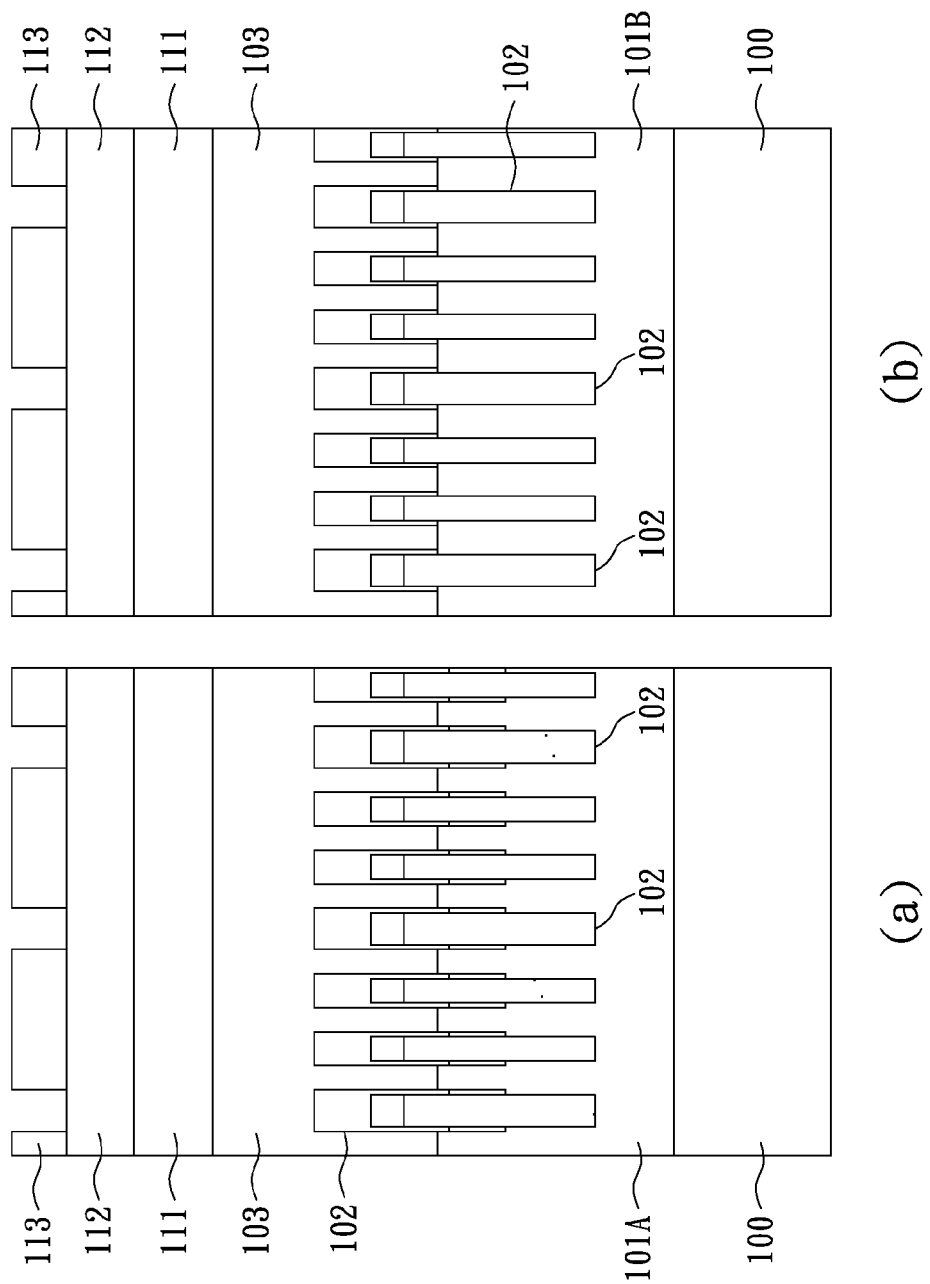

As shown in FIG. 2, a oxide hard mask 111 and a mask layer 112 are sequentially formed over the poly crystalline layer 103. The formation of the oxide hard mask 111 is, but not limited to, by deposition at the temperature higher than 725° C. The formation of the mask layer 112 is, but not limited to, formed by spinning. Furthermore, an optical mask 113 having predetermined patterns can be further formed over the mask layer 112.

Figure 3:
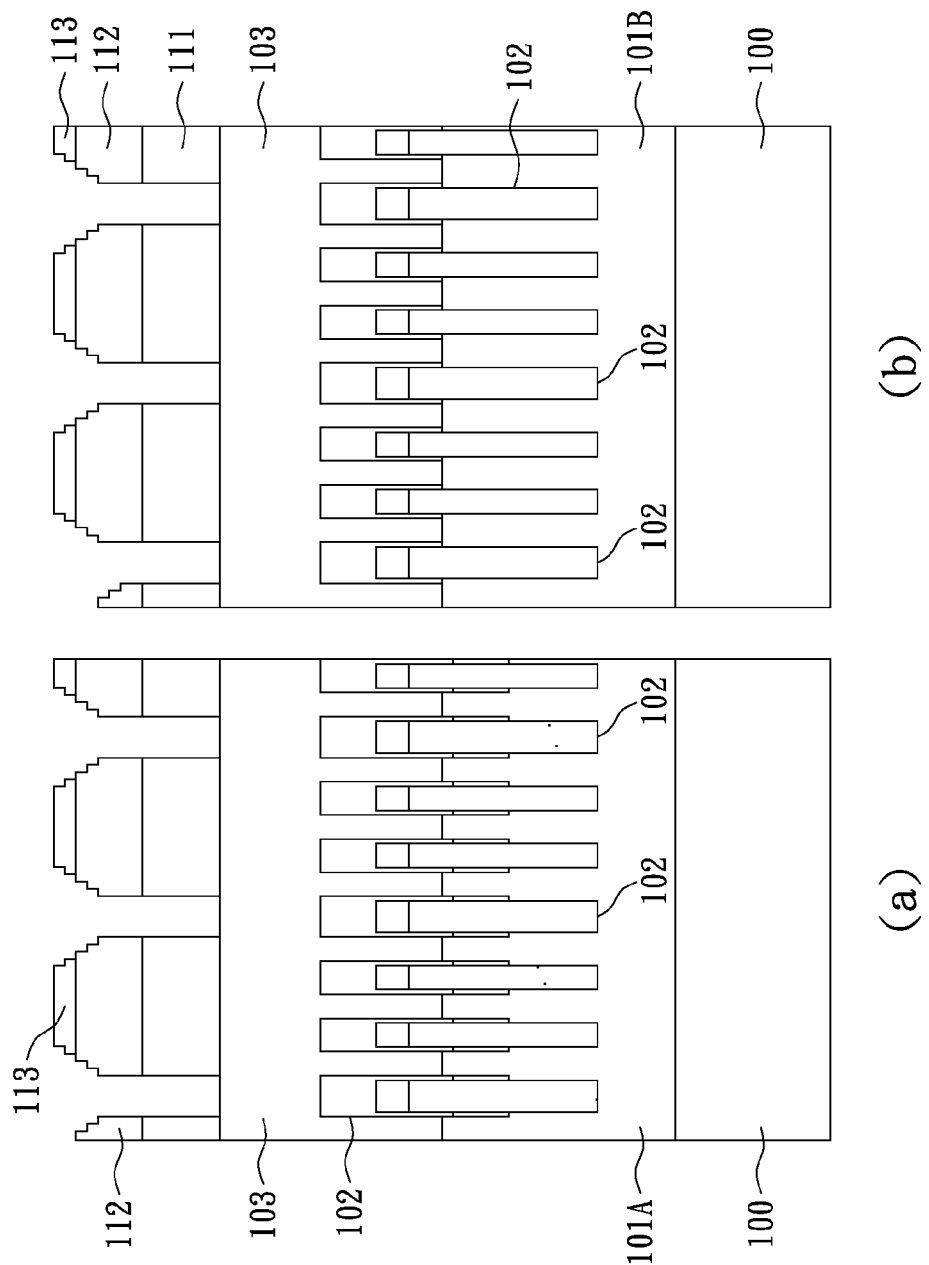
Figure 4:
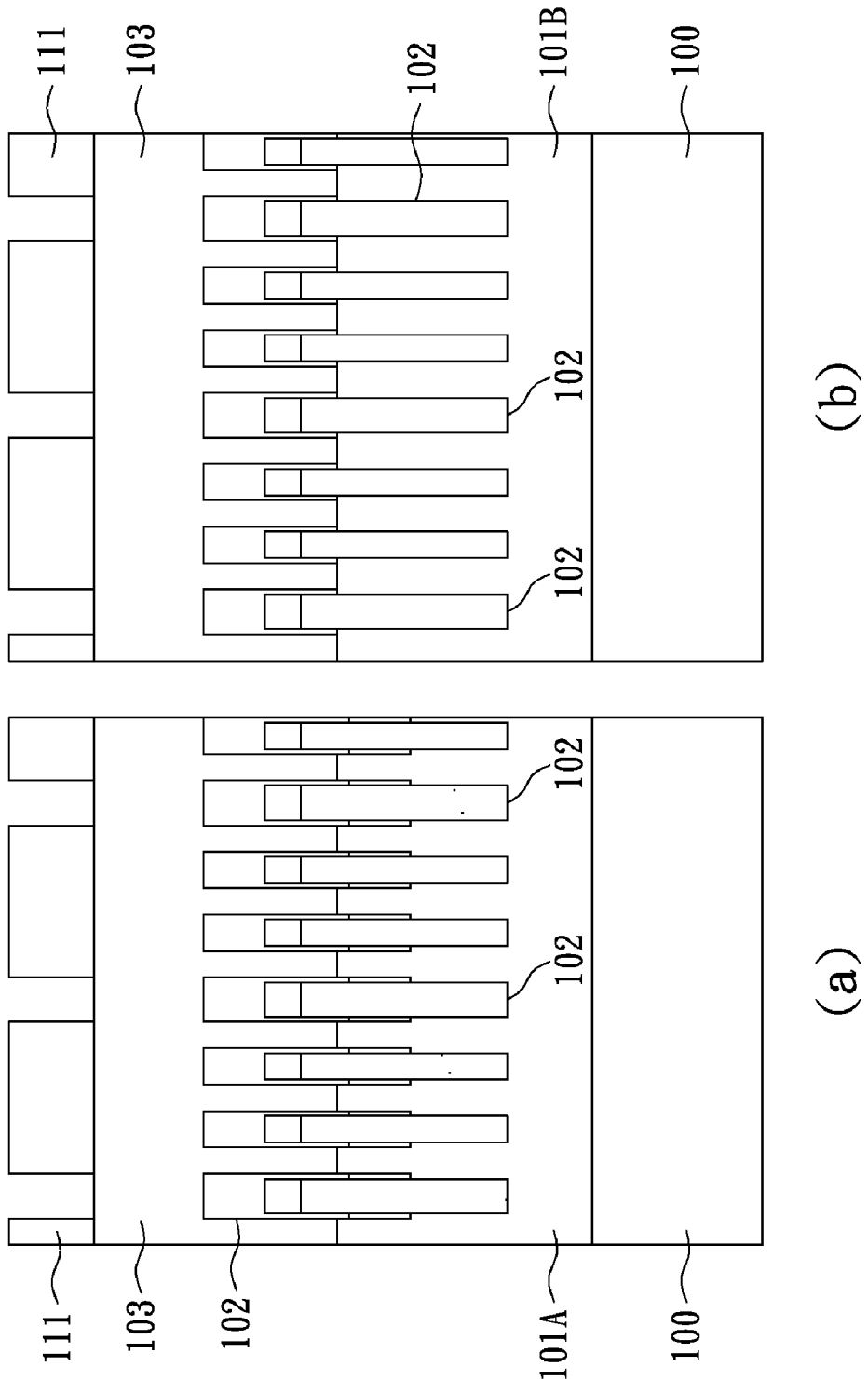

As shown in FIG. 3 and FIG. 4, the patterns of the optical mask 113 are correspondingly transferred to the oxide hard mask 111 and the mask layer 112. More specifically, the transferring of the patterns of the optical mask 113 to the oxide hard mask 111 and the mask layer 112 is achieved by etching, as shown in FIG. 3. Then the mask layer 112 is removed and a cleansing process is performed, as shown in FIG. 4.

Figure 5:
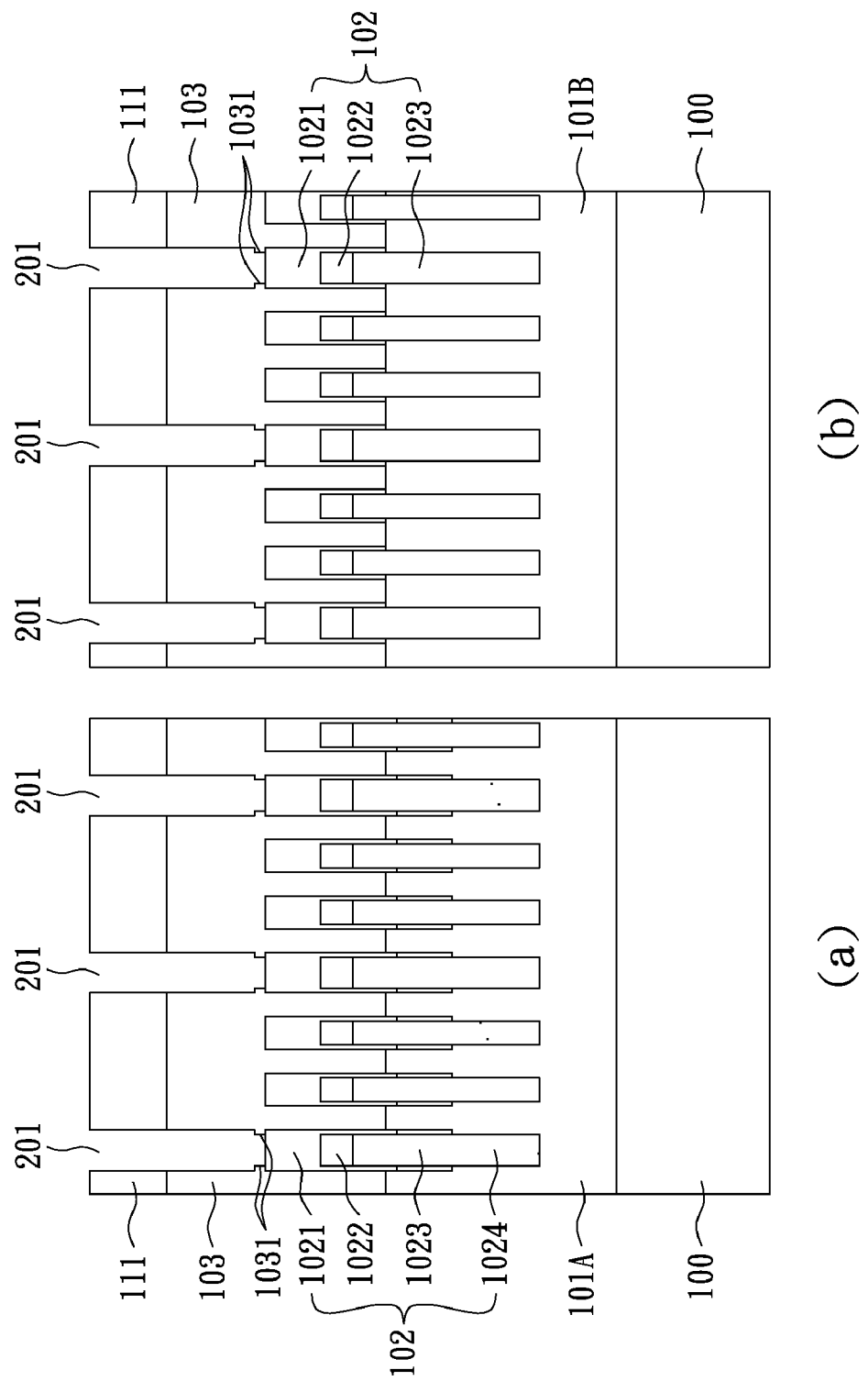

Referring to FIG. 5, a poly etching is performed according to the transferred patterns of the mask layer 112 to from the openings 201 in the poly crystalline layer 103. It is noted that this step is a tapered etching process which a protrusion 1031 is formed at a bottom of each opening 201 in the poly crystalline layer 103.

Figure 6:
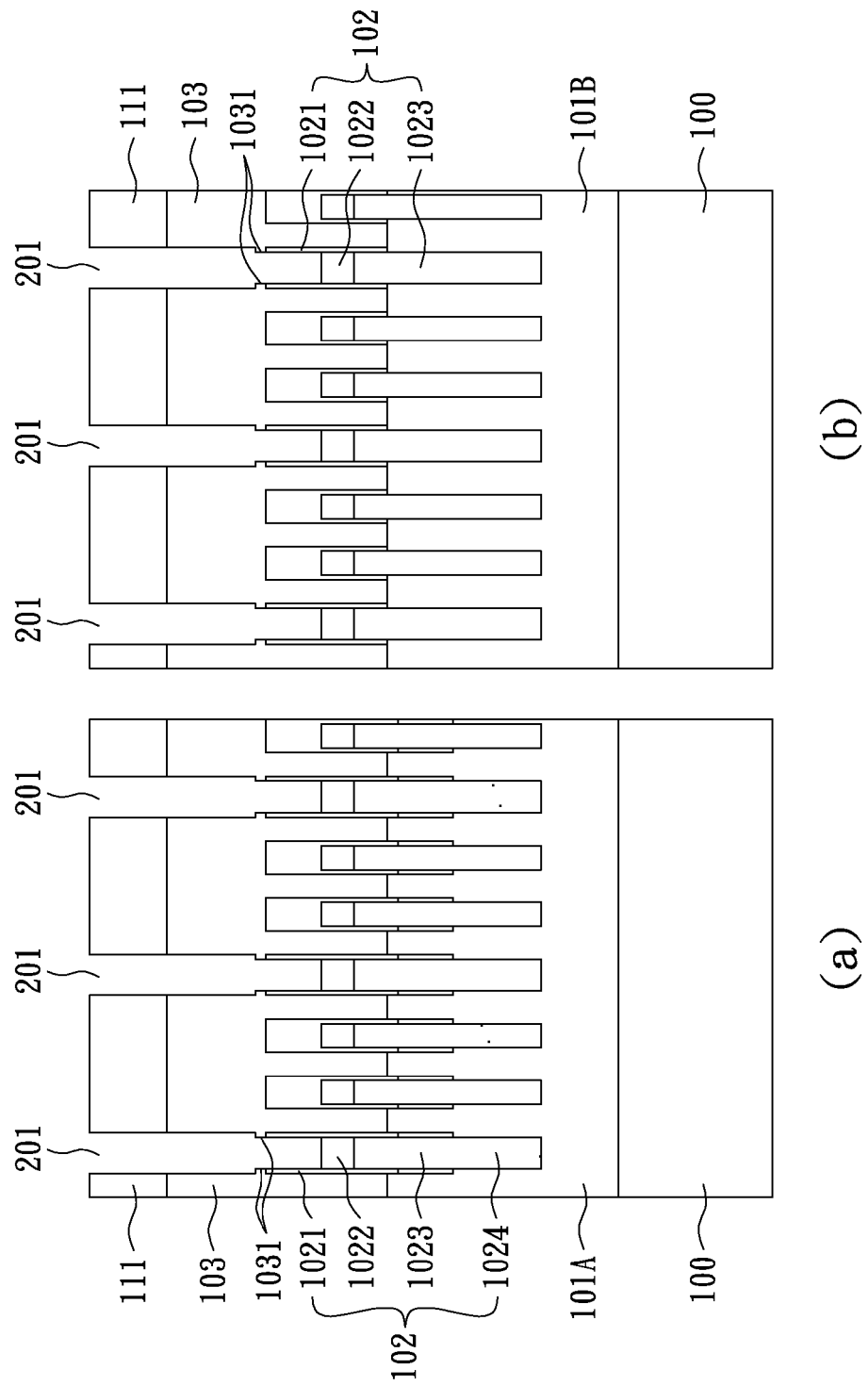
Figure 7:
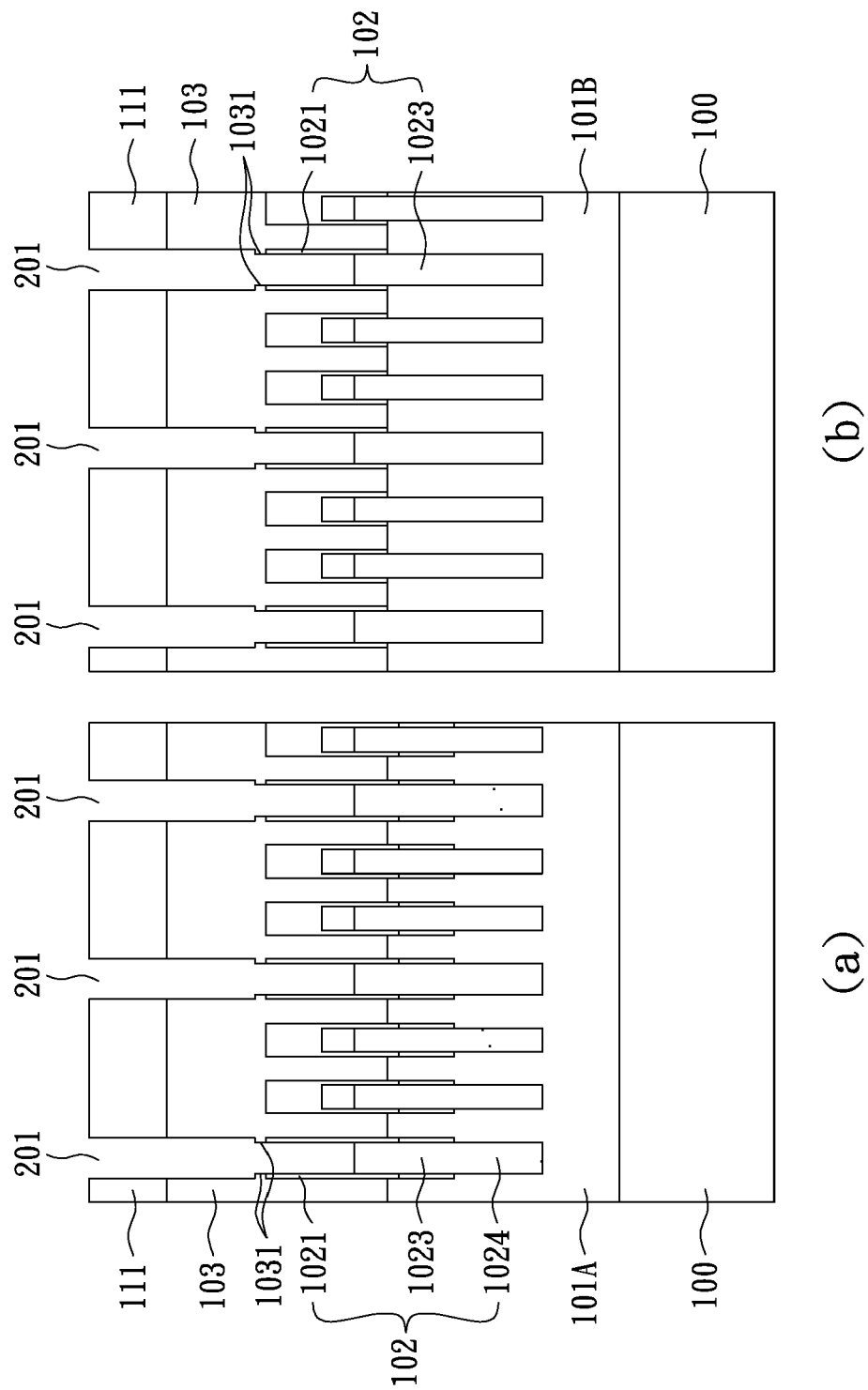
Figure 8:
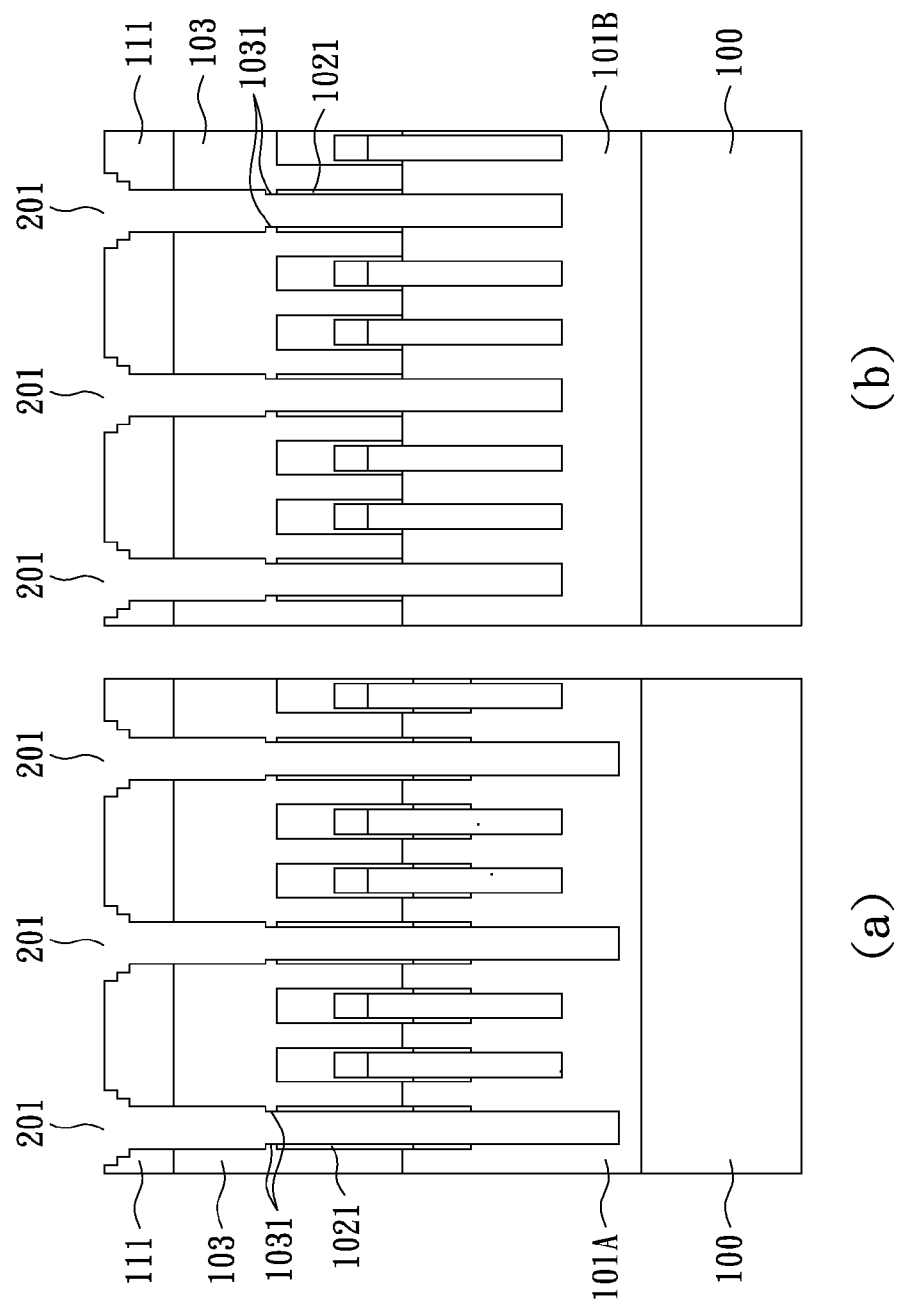

Referring to FIG. 6 through FIG. 8, at the next step, each of the grounded gates 102 is removed so that the openings 201 can extend downward. The detailed description of this step is illustrated as follows.

Referring FIG. 6, the nitride layer 1021, on each of the grounded gates 102, is removed by nitride etching in a manner that sidewalls of the nitride layer 1021 is left by using the protrusions 1031 of the poly crystalline layer 103. This etching is selective to the silicon and oxide and stops on the metal gate 1022 of tungsten.

Referring to FIG. 7, the metal gate 1022 of each of the grounded gates 102 is removed. In one embodiment, the metal gates of tungsten by isotropically etching for tungsten material.

Referring to FIG. 8, the RAD region 1023 of each grounded gate 102 is removed. In one embodiment, an anisotropically polymerizing etching process for silicon material is used to remove the RAD regions 1023. It is noted that in this step, the etched depth of the shallow trench isolation structure 101A indicated by the parts (a) differs from that of the shallow trench isolation oxide/nitride 101B indicated by the part (b). The openings 201 in the shallow trench isolation structure 101A have a depth that is between the depths of RAD region 1023 (i.e. FIN-FET region 1024) and the shallow trench isolation structure 101A. The openings 201 in the shallow trench isolation oxide/nitride 101B have a similar or the same depth as the RAD region 1023.

Furthermore, when in the above polymerizing etching up to a top of the FIN-FET region 1024, an oxide punching step can be further performed. Alternatively, a step of removing polymers can be further added.

Thereafter, the openings 201 become to be between the shallow trench isolation structure 101A and the shallow trench isolation oxide/nitride 101B. The grounded gates are then removed.

Figure 9:
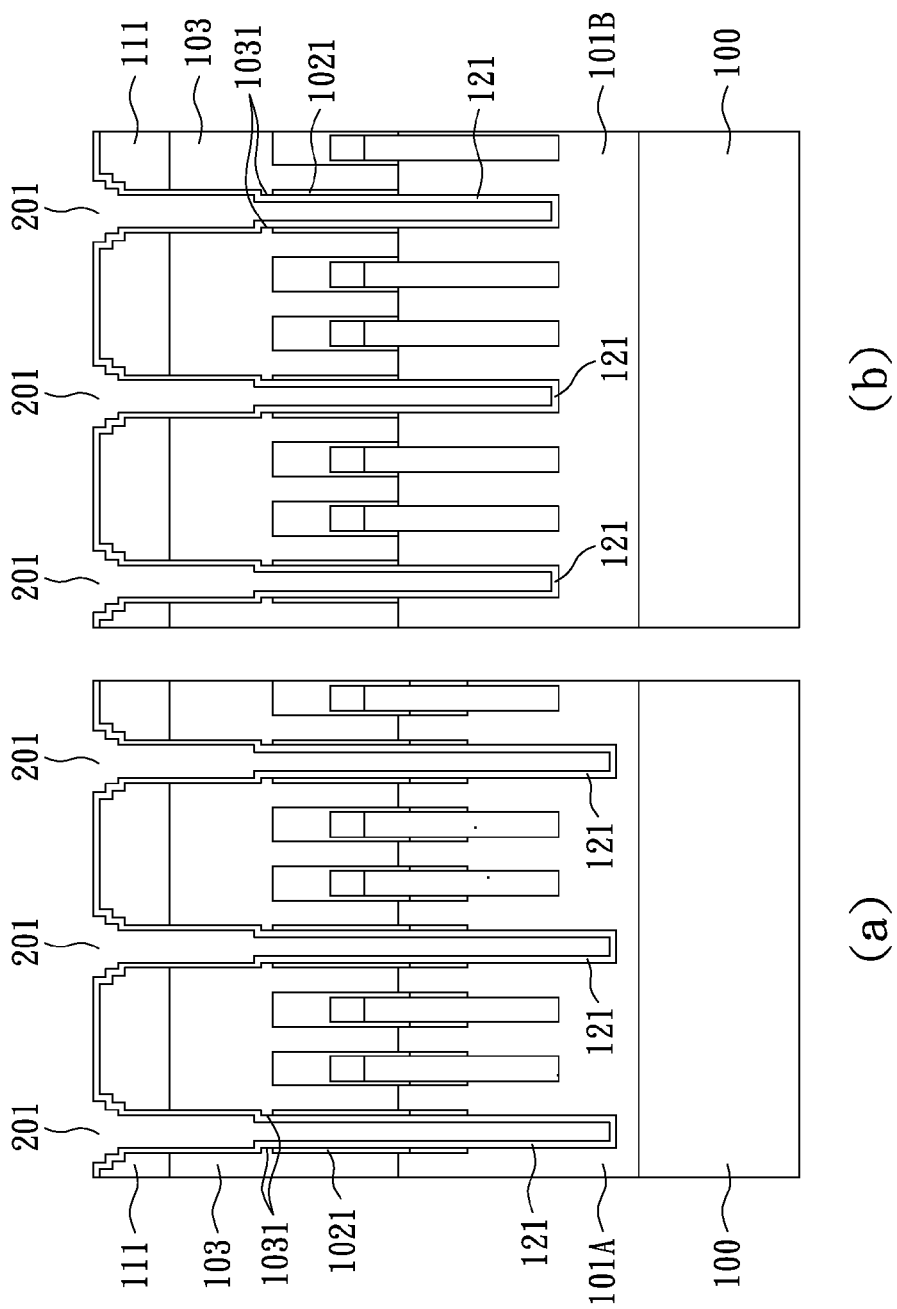
Figure 10:
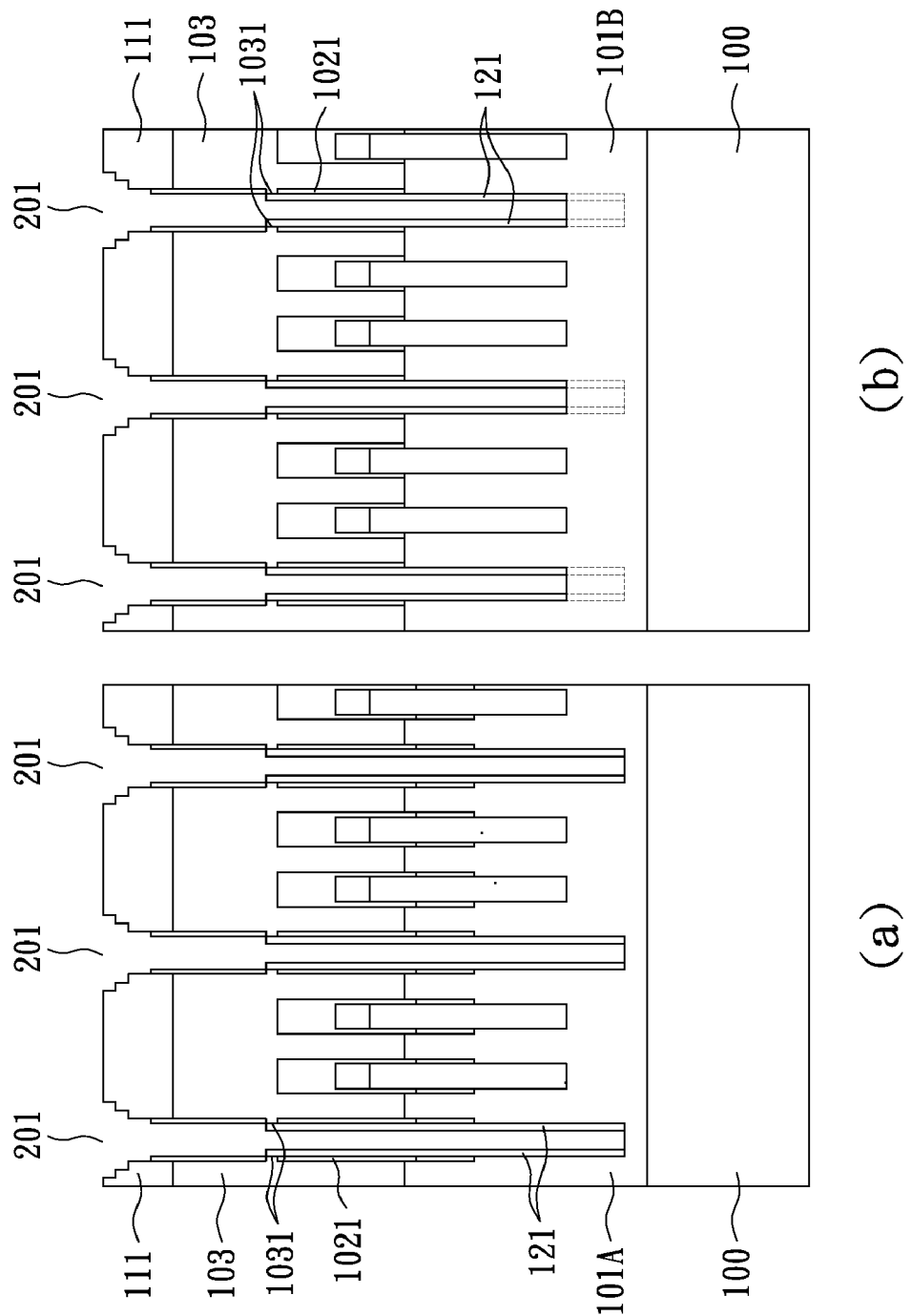

Referring to FIG. 9 and FIG. 10, at the next step, a spacer 121 is formed on each sidewall of each opening 201. The detailed description of the formation of the spacers 121 is as follows.

Referring to FIG. 9, spacers 121 of nitride are deposited over the sidewalls and the bottom of the openings 201. In other words, a continuous nitride layer as the structure of the spacer 121 covers all the exposed surface of the openings 201.

Referring to FIG. 10, the parts of each spacer 121 at the bottom of the corresponding opening 201 is removed by etching, leaving the portions of each spacer 121 of nitride at sidewalls of each opening 201. Consequently, the shallow trench isolation structure 101A and the shallow trench isolation oxide/nitride 101B expose through the bottoms of the openings 201.

Figure 11:
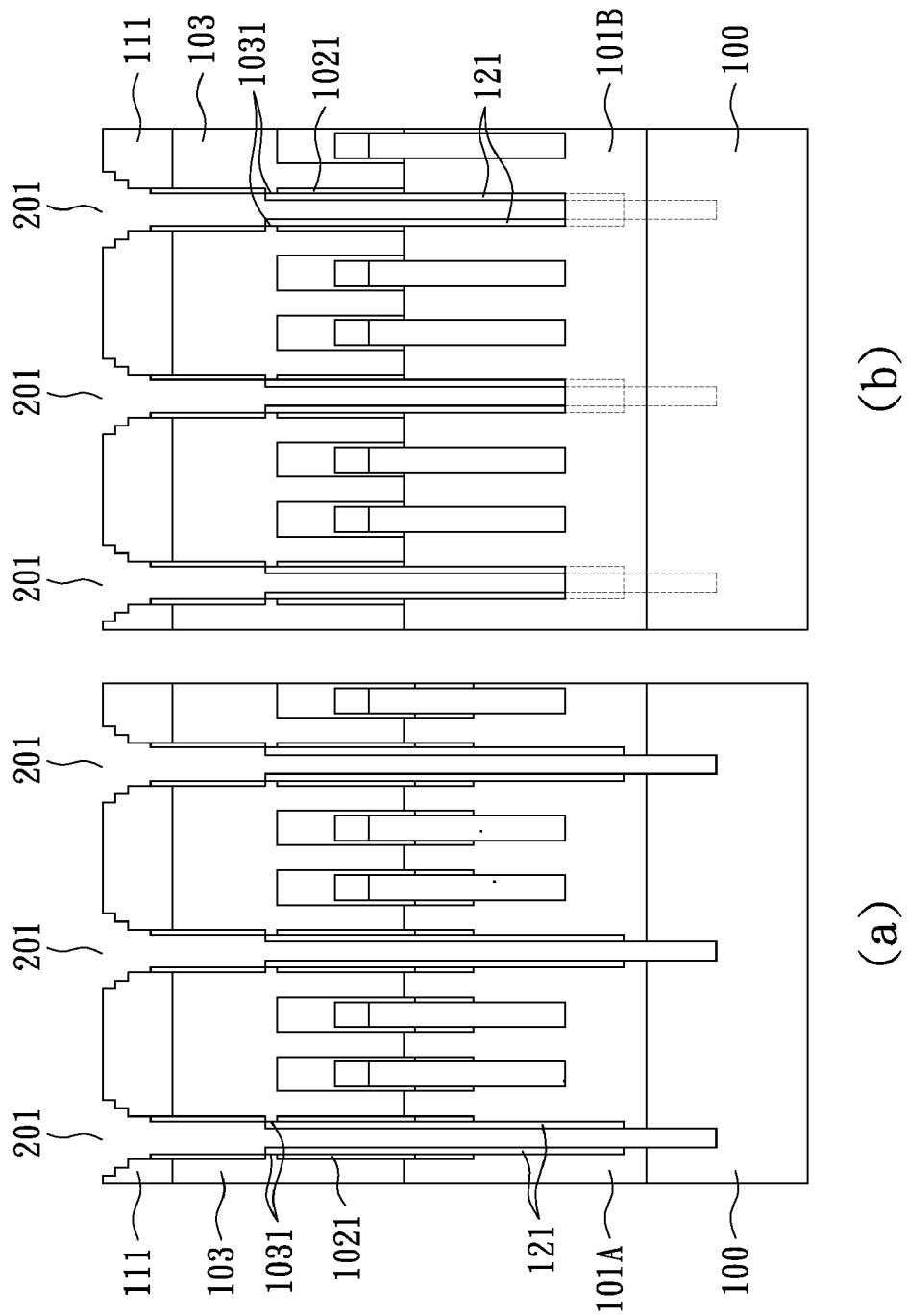

Referring to FIG. 11, at the next step, an opening in the shallow trench isolation structure 101A is formed to reach the substrate 100. In one embodiment, an anisotropic etching is performed on the openings 201 so that an opening of the bottoms of the openings 201 can be formed and reaches to the substrate 100. It is noted that the selective etching does not move down the bottoms of the openings 201 in the shallow trench isolation oxide/nitride 101B.

Figure 12:
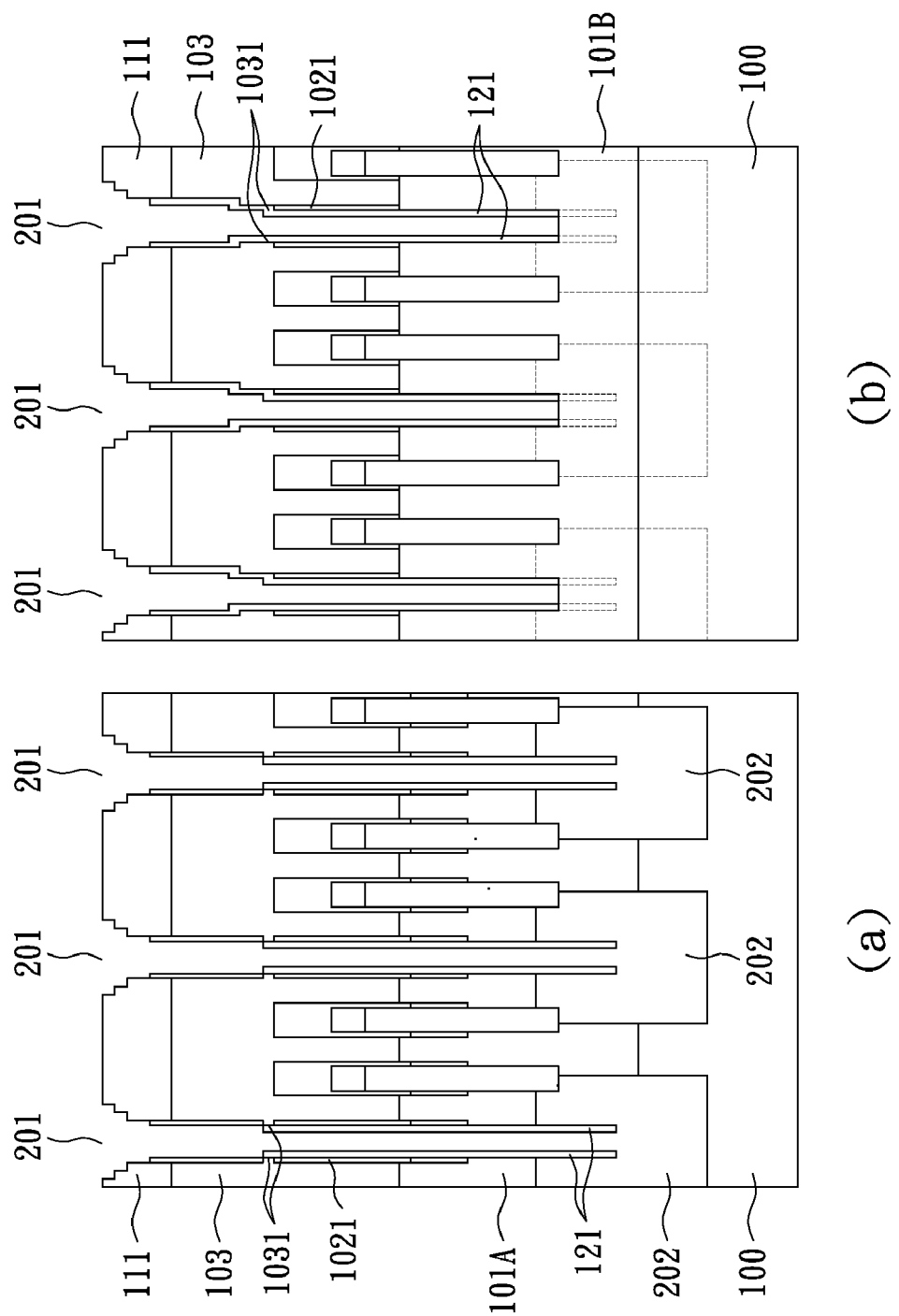

Referring to FIG. 12, at the next step, an isotropic silicon etching process is performed to form a bottle shape profile, so that isolation spaces 202 are formed over the bottoms of the openings 201. In other words, the isolation space 202 extends to the underside of the drain of the FIN FET transistor. In one embodiment, a horizontal etching process for silicon is performed to partially remove the shallow trench isolation structure 101A and the substrate 100 as well. It is noted that the part (a) and the part (b) of the substrate 100 shown in FIG. 12 are removed at this etching step. The length of horizontal etching is 30% to 110% of a channel length. Furthermore, in this embodiment, the horizontal etching process for silicon is a wet etching process and selective to oxide and nitride. Therefore, in addition to the channel formed in the FIN-FET region 1024, a cell junction is kept from contacting with the substrate 100. In other words, the part of the substrate 100 beneath the drain at cell sides is removed so as to reduce the interaction between the substrate 100 and the drain of a bit line.

Figure 13:
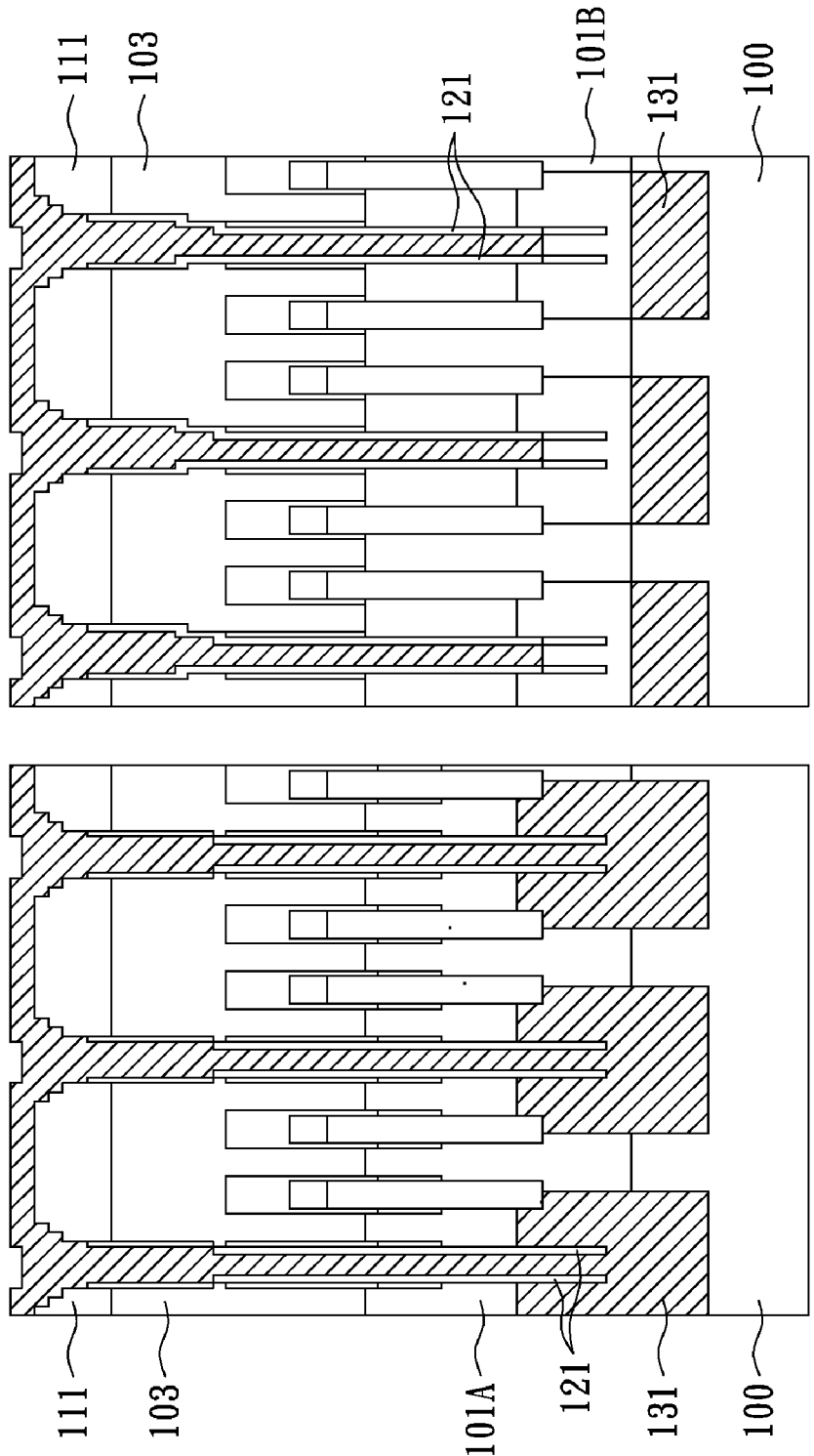

Referring to FIG. 13, at the next step, gate oxide 131 is used to fill passivate the Silicon surfaces in the isolation spaces 202, and then for example, SOD or tetraethoxysilane (TEOS) is used to completely fill the vertical part of the opening 201. The temperature at this step needs to be controlled in order to avoid any shift of devices or stress related issues.

Figure 14:
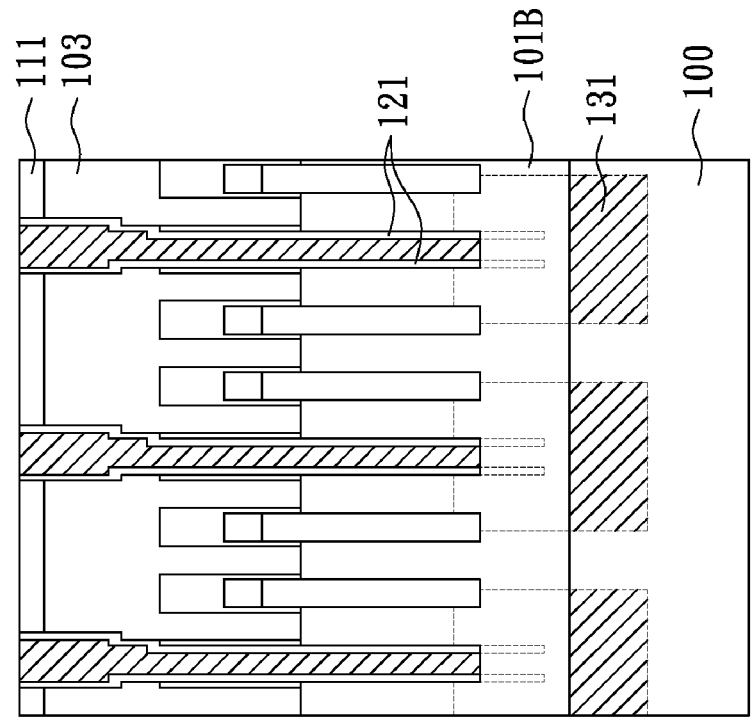
Figure 14:
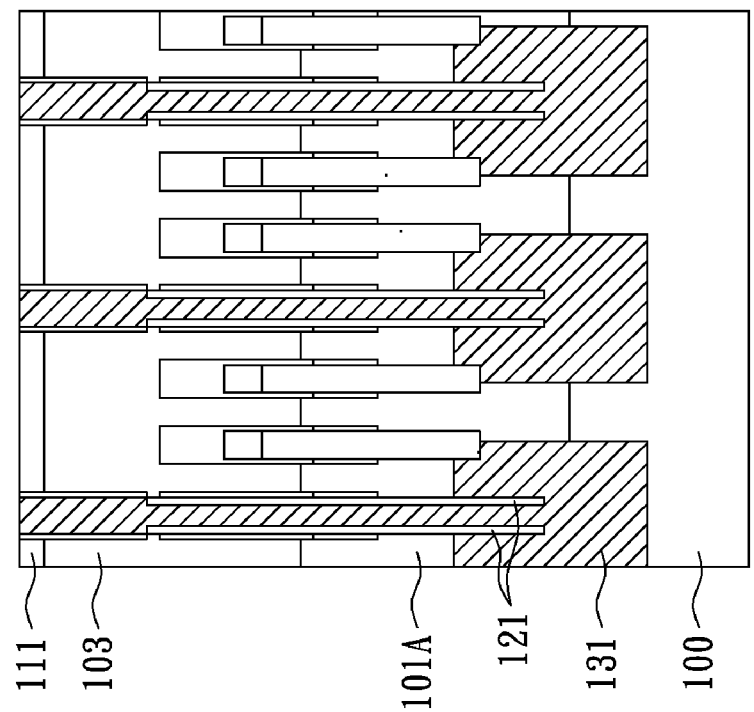

Referring to FIG. 14, a chemical mechanic polishing process is further performed and then a series of steps of a standard procedure for manufacturing DRAM is performed.

According to the manufacturing method of the invention, the obtained FIN-FET has a floating body at its storage node. The body is tied on the bit line which has a vertical RAD region.

In the light of the above, the invention offers the following advantages.

1. The manufacturing method of the invention uses the isotropic silicon etching process to partially remove the substrate so that no current can flow to the substrate through the cell side, thereby avoiding any current leakage.

2. The manufacturing method of the invention uses the grounded gates as disposable features to form suitable openings and isolation spaces, and further uses the gate oxide to provide improved isolation.

The above-mentioned descriptions represent merely the preferred embodiment of the present invention, without any intention to limit the scope of the present invention thereto. Various equivalent changes, alternations or modifications based on the claims of present invention are all consequently viewed as being embraced by the scope of the present invention.

What is claimed is:

1. A manufacturing method for a fin field effect transistor having a floating body, comprising:
   providing a substrate, forming a shallow trench isolation structure and a shallow trench isolation oxide/nitride, forming a plurality of grounded gates in the shallow trench isolation structure and the shallow trench isolation oxide/nitride, and forming a poly crystalline layer over the shallow trench isolation structure and the shallow trench isolation oxide/nitride and between the grounded gates, wherein each grounded gate has a nitride layer, a metal gate and a recessed access device region;
   performing an etching process to form in the poly crystalline layer a plurality of openings which expose the corresponding grounded gates, wherein a bottom of each opening has a protrusion;
   removing each grounded gate so that the openings extend downward, wherein the openings in the shallow trench isolation structure has a depth between the depths of the recessed access device region and the shallow trench isolation structure, and the openings in the shallow trench isolation oxide/nitride has a similar depth as the recessed access device region;
   forming spacers on sidewalls of the openings;
   forming an opening in the shallow trench isolation structure to the substrate;
   performing an isotropic silicon etching to form isolation spaces at the bottoms of the openings; and
   filling up gate oxide in the openings and the isolation spaces.

2. The manufacturing method of claim 1, wherein the step of performing an etching process to form in the poly crystalline layer a plurality of openings which expose the corresponding grounded gates comprises:
   forming an oxide hard mask and a mask layer in turns in the poly crystalline layer;
   transferring patterns of an optical mask to the oxide hard mask and a mask layer; and
   transferring patterns of the mask layer to the poly crystalline layer by etching to form the openings.

3. The manufacturing method of claim 2, wherein at the step of forming an oxide hard mask and a mask layer in turns in the poly crystalline layer, the oxide hard mask is formed by depositing at a temperature higher than 725° C.

4. The manufacturing method of claim 1, wherein the step of removing each grounded gate comprises:
   removing the nitride layer of each grounded gate, leaving sidewalls of the nitride layer by using the protrusion of the poly crystalline layer;
   removing the metal gate of each grounded gate; and
   removing the recessed access device region of each grounded gate.

5. The manufacturing method of claim 4, wherein at the step of removing the nitride layer of each grounded gate, an etching process selective to silicon and silicon oxide is used to remove the nitride layer of each grounded gate.

6. The manufacturing method of claim 4, wherein at the step of removing the recessed access device region of each grounded gate, an anisotropically polymerizing etching process is used to remove the recessed access device region of each grounded gate.

7. The manufacturing method of claim 1, wherein the step of forming spacers on sidewalls of the openings comprises:
   depositing a nitride layer on sidewalls and a bottom of each opening; and
   removing the part of the nitride layer on the bottom of each opening by etching.

8. The manufacturing method of claim 1, wherein at the step of extending bottoms of the openings in the shallow trench isolation structure to the substrate, an anisotropic etching process for silicon is used to extend the bottoms of the openings to the substrate.

9. The manufacturing method of claim 1, wherein at the step of performing an isotropic silicon etching, a horizontal etching process is used to partially remove the shallow trench isolation structure and the substrate as well to form the isolation spaces, the horizontal etching length being 30% to 110%.

10. The manufacturing method of claim 1, after the step of filling up gate oxide in the openings and the isolation spaces, further comprising a step of performing a chemical mechanic polishing process.

* * * * *